(12) United States Patent
Shreeram et al.

(10) Patent No.: US 10,777,561 B2
(45) Date of Patent: Sep. 15, 2020

(54) SEMICONDUCTOR STRUCTURE FORMATION

(71) Applicant: Micron Technology, Inc., Boise, ID (US)

(72) Inventors: Devesh Dadhich Shreeram, Boise, ID (US); Sanjeev Sapra, Boise, ID (US); Masihhur R. Laskar, Boise, ID (US); Darwin Franseda Fan, Boise, ID (US); Jerome A. Imonigie, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/258,987

(22) Filed: Jan. 28, 2019

(65) Prior Publication Data
US 2020/0243528 A1 Jul. 30, 2020

(51) Int. Cl.
*H01L 27/108* (2006.01)

(52) U.S. Cl.
CPC .... *H01L 27/1087* (2013.01); *H01L 27/10829* (2013.01)

(58) Field of Classification Search
CPC .............. H01L 27/1087; H01L 27/10829
See application file for complete search history.

(56) References Cited

U.S. PATENT DOCUMENTS

| 7,662,693 | B2 | 2/2010 | Bhattacharyya | |
|---|---|---|---|---|
| 7,875,529 | B2 | 1/2011 | Forbes et al. | |
| 7,875,733 | B2 | 1/2011 | Forbes et al. | |
| 8,274,777 | B2 | 9/2012 | Kiehlbauch | |
| 2001/0004119 | A1* | 6/2001 | Foraboschi | H01L 23/3171 257/315 |
| 2008/0277760 | A1* | 11/2008 | Kohler | H01L 21/31116 257/532 |
| 2013/0200910 | A1* | 8/2013 | Ellis-Monaghan | H01L 22/14 324/755.01 |
| 2015/0179569 | A1* | 6/2015 | Hsu | H01L 21/76802 257/774 |

FOREIGN PATENT DOCUMENTS

| JP | 04369854 A * 12/1992 |
|---|---|
| KR | 100399915 B1 * 9/2003 |

* cited by examiner

*Primary Examiner* — Michele Fan
(74) *Attorney, Agent, or Firm* — Brooks, Cameron & Huebsch, PLLC

(57) ABSTRACT

Methods, apparatuses, and systems related to reduction of tapering on a sidewall of an opening are described. An example method includes forming a silicate material comprising a gradient borophosphosilicate glass (BPSG) stack on a semiconductor structure. The example method further includes etching a portion of the silicate material to form an opening within the silicate material having sidewalls, wherein the gradient BSPG stack comprises varying concentrations of boron and phosphorous to reduce tapering of the sidewalls in response to the etching.

16 Claims, 8 Drawing Sheets

SEMICONDUCTOR STRUCTURE FORMATION

TECHNICAL FIELD

The present disclosure relates generally to semiconductor devices and methods, and more particularly to reduction of tapering on a sidewall of an opening on a semiconductor substrate material.

BACKGROUND

Memory devices are typically provided as internal, semiconductor, integrated circuits in computers or other electronic devices. There are many different types of memory, including random-access memory (RAM), read only memory (ROM), dynamic random-access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
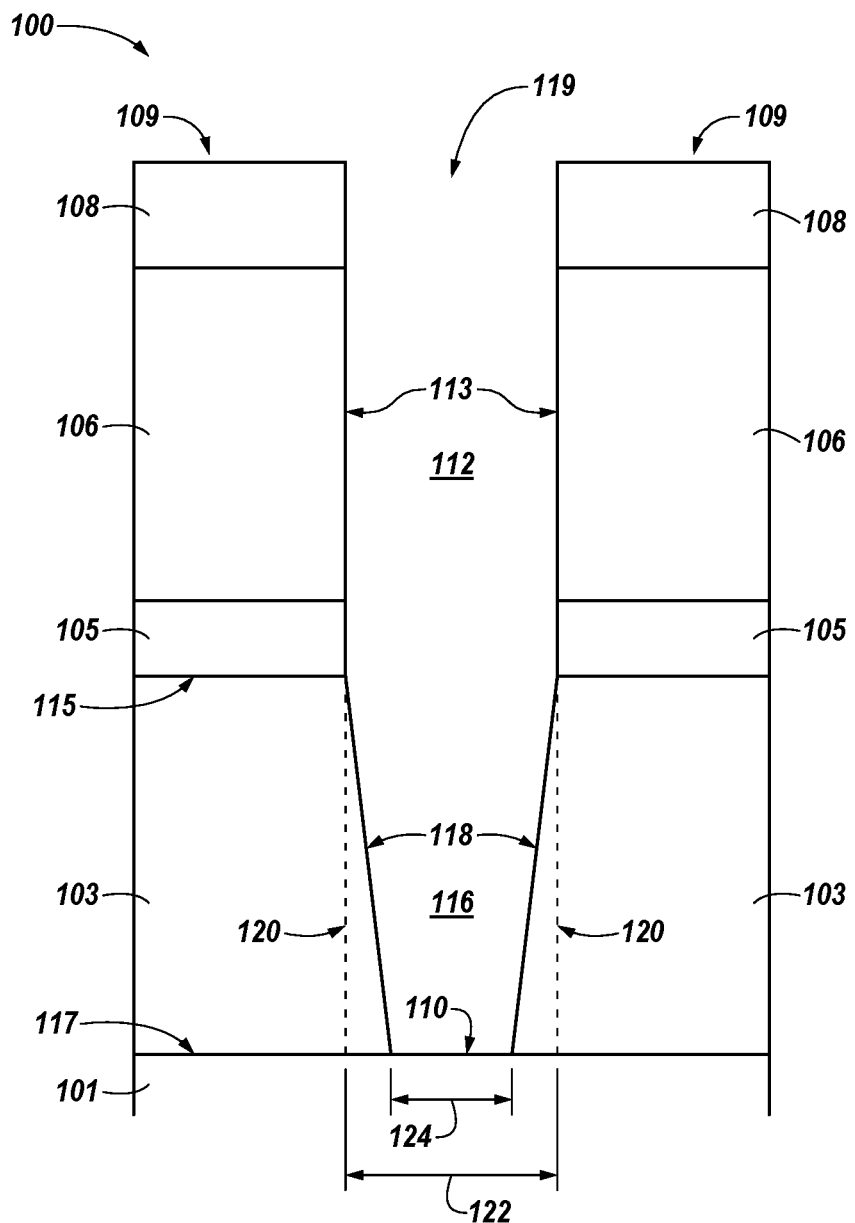
FIGS. 1-4 illustrate cross-sectional views of a portion of an example memory device at various points in time in an example fabrication sequence for reduction of tapering on a sidewall of an opening in accordance with a number of embodiments of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device.

In one example process a trench may be formed through one or more layers of materials to receive subsequent processing steps to form a discrete device such as a storage node, e.g., vertical capacitor to a dynamic random access memory (DRAM) cell. Embodiments are not limited to this example. As design rules scale to smaller dimensions, deeper trenches with more narrow widths may be desired.

However, etching to form such an opening at smaller dimensions may result in tapering (e.g., creating a difference in width from a top to bottom of a layer) on at least a portion of a sidewall of the opening. In some instances, the formation of such an opening may also result in necking (i.e., creating of a distortion at an interface between two layers), or bending (i.e., creating of an unstable or weak point) at least a portion of a sidewall of the opening.

For example, formation of the opening into the sidewall structural material may, in a number of embodiments, be performed using an etching process that is selective to a number of chemical compounds in the sidewall structural material. One or more of the chemical compounds may have a resistance to the etching process that is higher than that of the other chemical compounds in the sidewall structural material. A chemical compound having a higher resistance to a particular selective etch chemistry may have a lower etch rate than another chemical compound having a lower resistance and therefore a resulting higher etch rate, to the particular selective etch chemistry. Such variations in etch resistance of the one or more of the chemical compounds may result in tapering, necking or bending to occur on the sidewall of the opening extending into the cavity of the opening during the etching process.

Such tapering, necking or bending, if not reduced (e.g., removed), may contribute to unintended consequences related to the electrical properties of the structure for the data access, storage, and/or processing functions of the memory device. For example, as described further herein, a capacitor formed in association with the opening may have a structural feature (e.g., an electrode material) formed on the sidewall of the opening. The tapering, necking or bending remaining on the sidewall of the opening may contribute to a reduction in the electrical isolation of nodes to the capacitor and/or an overall surface area to such storage nodes of the device. Such reduction in effect may reduce a capacitance of the device and cause an increase in a probability of a short circuit fault occurring during subsequent use of the capacitor on a memory device.

The present disclosure includes methods, apparatuses, and systems related to reduction of tapering, along with necking or bending along a sidewall of an opening formed in a silicate material. An example of a method described herein includes forming a silicate material comprising a gradient borophosphosilicate glass (BPSG) stack on a semiconductor structure substrate. The example method further includes etching a portion of the silicate material to form an opening within the silicate material having sidewalls, wherein the gradient BSPG stack comprises varying concentrations of boron and phosphorous to reduce tapering of the sidewalls in response to the etching.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 103 may reference element "103" in FIG. 1, and a similar element may be referenced as 503 in FIG. 5. In some instances, a plurality of similar, but functionally and/or structurally distinguishable, elements or components in the same figure or in different figures may be referenced sequentially with the same element number (e.g., 419-1 and 419-2 in FIG. 4).

FIG. 1 illustrates a cross-sectional view of a portion of an example memory device at a point 100 in time in an example semiconductor fabrication sequence for reduction of tapering, necking or bending on a sidewall of an opening in accordance with a number of embodiments of the present disclosure. The fabrication sequence illustrated in FIG. 1 is shown at a point 100 in time that corresponds to various processing activities already having been performed in the fabrication sequence.

A first silicate material 103 is shown to have been formed on an underlying substrate material. The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

The first silicate material 103 may, in a number of embodiments, have been formed from a borophosphosilicate glass (BPSG). The BPSG may include a silicon containing compound doped with various concentrations and/or ratios of a boron containing compound and a phosphorus containing compound. The silicon (S) containing compound may be silicon dioxide ($SiO_2$), which may be formed by oxidation of silane ($SiH_4$), among other possibilities. The boron (B) containing compound may be diboron trioxide ($B_2O_3$), which may be formed by oxidation of diborane ($B_2H_6$), among other possibilities. The phosphorus (P) containing compound may be diphosphorus pentoxide ($P_2O_5$), which may be formed by oxidation of phosphine ($PH_3$), among other possibilities. The S, B, and P containing compounds of the BPSG may include various isotopes of S, B, and P, as determined to be appropriate for functionality, formation, and/or removal of the first silicate material 103, as described herein.

The first silicate material 103 may be originally formed (e.g., deposited) as a gradient BPSG stack a surface 110 of the underlying substrate material 101. For example, the first silicate material 103 may be formed without a first opening 112 formed therein from an upper surface of the first silicate material 103 to the surface 110 of the underlying substrate material 101. The first silicate material 103 may, in a number of embodiments, be deposited to a thickness in a range of from around 400 nanometers (nm) to around 750 nm above the surface 110 of the underlying substrate material 101.

A first nitride material 105 is shown to have been formed on a surface of the first silicate material 103 opposite from the underlying substrate material 101. The first nitride material 105 may be formed (e.g., deposited) as a single layer on an upper surface of the first silicate material 103. Alternatively, the first nitride material 105 may be formed (e.g., deposited) as two separate portions (e.g., layers) on the upper surface of the first silicate material 103. For example, the first silicate material 103 may be formed with an opening formed therein from an upper surface of the first nitride material 105 to an upper surface of the first silicate material 103.

The first nitride material 105 may be formed from a nitride material selected for dielectric or resistance properties. For example, one or more dielectric and/or resistor nitrides may be selected from boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material 105. The first nitride material 105 may, in a number of embodiments, be deposited to a thickness in a range of from around 15 nm to around 30 nm above the surface of the first silicate material 103.

A second silicate material 106 is shown to have been formed on a surface of the first nitride material 105 opposite from the first silicate material 103. The second silicate material 106 may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

The second silicate material 106 may be originally formed (e.g., deposited) as two separate portions (e.g., layers) on the surface of the first nitride material 105 opposite from the first silicate material 103. For example, the second silicate material 106 may be formed with the first opening 112 formed therein that extends from an upper surface of the second silicate material 106 to an upper surface of the first nitride material 105 or to an upper surface of the first silicate material 103.

A second nitride material 108 is shown to have been formed on a surface of the second silicate material 106 opposite from first nitride material 105. The second nitride material 108 may be formed (e.g., deposited) as a single layer on an upper surface of the second silicate material 106. Alternatively, the second nitride material 108 may be formed (e.g., deposited) as two separate portions (e.g., layers) on the two separate upper surfaces of the portions of second silicate material 106. For example, the second nitride material 108 may be formed with an opening formed therein from an upper surface 109 of the second nitride material 108 to an upper surface of the second silicate material 106.

Similar to the first nitride material 105, the second nitride material 108 may be formed from a nitride material selected for dielectric or resistance properties. For example, one or more dielectric and/or resistor nitrides may be selected from BN, $SiN_X$, $Si_3N_4$, AlN, GN, TaN, $Ta_2N$, TiN, $Ti_2N$), and WN, $W_2N$, $WN_2$, among other possibilities, for formation of the second nitride material 108. In various embodiments, the first nitride material 105 and the second nitride material 108 may be formed from a same single nitride or a same mixture of nitrides or the first and second nitride materials 105, 108 each may be formed from a different single nitride or a different mixture of nitrides dependent upon, for example, various uses to which the nitrides may be applied. The second nitride material 108 may, in a number of embodiments, be deposited to a thickness in a range of from around 80 nm to around 150 nm above the surface of the second silicate material 106.

A support structure may be formed for the second silicate material 106 stacked on the first silicate material 103 adjacent the substrate material 101. The support structure may, in a number of embodiments, be formed by forming (e.g., depositing) the first nitride material 105 between the first silicate material 103 and the second silicate material 106 and forming the second nitride material 108 on an opposite surface of the second silicate material 106. The first and second nitride materials 105, 108 may form the support structure by extending between and connecting (e.g., attaching) to features associated with multiple capacitors (e.g., as shown and described in connection with FIGS. 4-6) or other structural elements of the example memory device. A support structure formed as such may enable a stack of the first and the second silicate materials 103, 106 to be maintained in a more static configuration relative to each other and the underlying substrate material 101 than provided by the first and the second silicate materials 103, 106 themselves.

The first opening 112 or trench may be formed through the first nitride material 105, the second silicate material 106, and the second nitride material 108. The first opening 112 may have a width or a diameter in a range of from around 20 nm to around 60 nm. As a consequence of deposition characteristics of TEOS and a selected etch process, sidewalls 113 forming the first opening 112 may be formed to be relatively straight. For example, both sidewalls 113 forming the first opening 112 may, among other possible configurations, be formed without notable tapering, described herein. In this way, in a number of embodiments, the sidewalls 113 forming the first opening 112 may be deposited to have a substantially constant width, or the continuous sidewalls 113 of the first opening 112 may be deposited to have a substantially constant diameter, from a top to a bottom of the first opening 112 in the second silicate material 106. The second silicate material 106 may, in a number of embodiments, be deposited to a thickness in a range of from around 300 nanometers (nm) to around 600 nm above the surface of the first nitride material 105.

An etch process (e.g., a first wet etch process or dry etch process) may be utilized to etch via (e.g., through) the already formed first opening 112 into the first silicate material 103 to form a second opening 116 within the first silicate material 103. Performance of the etch process may result in formation of a combination of the first opening 112 and the second opening 116 in order to form a resultant opening 119 that extends from the upper surface 109 of the second nitride material 108 to the surface 110 of the substrate material 101. The resultant opening 119 may have a height in a range of from around 800 nm to around 1,500 nm.

The width or diameter of the first opening 112 being in a range of from around 20-60 nm and the height of the resultant opening 119 being in a range of from around 800-1500 nm may result in an aspect ratio (AR) of the height to width being in a range of from around 25:1 to around 50:1 as the etch progresses through the first silicate material 103 and approaches the substrate material 101. Such a high AR, along with difficulties involved in controlling removal of the first silicate material 103 that result from varying etch rates of the BPSG formed as a bi-layer, may contribute a tapering 118 of sidewalls 120 of the second opening 116 in the first silicate material 103 during the selected etch process (e.g., the etch chemistry, plasma formation, velocity of plasma projection, etc.). Such tapering 118 of the sidewalls 120 forming the second opening 116 during the etch process may cause a diameter 122 of the resultant opening 119 to decrease (e.g., progressively decrease) along the second opening 116 of the first silicate material 103 as the etch progresses toward the substrate material 101.

For example, the tapering 118 may extend from an upper portion 115 of the first silicate material 103 to a lower portion 117 of the first silicate material 103, causing the diameter 122 of the resultant opening 119 that results when the tapering 118 of the sidewalls 120 does not occur to progressively decrease to a decreased diameter 124. Such decreased diameter 124, which in some cases may be between approximately 6-9 nm, results in a decrease in the surface area along the substrate material 101. This decreased surface area may reduce the capacitance of the capacitor material. In addition, the decreased surface area may further result in necking (i.e., creating of a distortion at an interface between two layers), or bending (i.e., creating of an unstable or weak point) at least a portion of the sidewall 120 of the second opening 116, causing possible shorts to occur.

Figure 2:
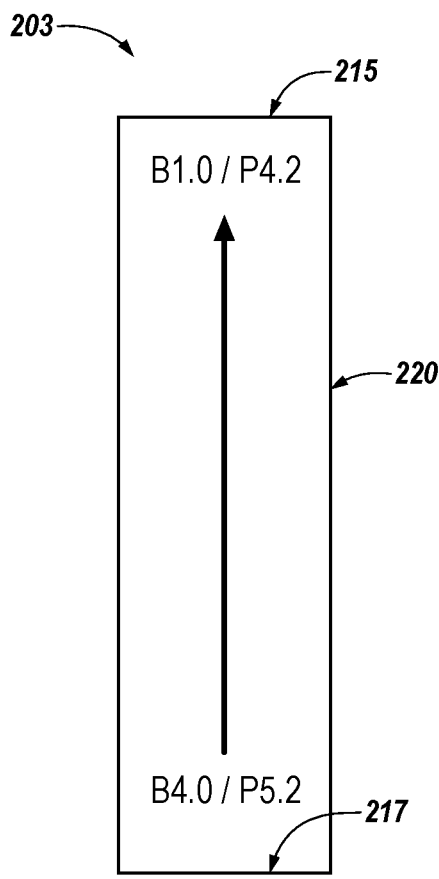

FIG. 2 is a schematic diagram of a silicate material layer formed during fabrication of a memory device in accordance with a number of embodiments of the present disclosure. In order to control the etch rate during etching of a silicate material 203, the silicate material 203 may be formed as a gradient stack of BPSG having a gradient BPSG formed in such a way to control an etch rate to reduce the likelihood of tapering of a sidewall 220 of the silicate material 203. For example, the silicate material 203 may include a silicon (S) containing compound doped with gradually varying concentrations and/or ratios of a boron (B) containing compound and a phosphorus (P) containing compound. The silicon (S) containing compound may be silicon dioxide ($SiO_2$), which may be formed by oxidation of silane ($SiH_4$), among other possibilities. The boron (B) containing compound may be diboron trioxide ($B_2O_3$), which may be formed by oxidation of diborane ($B_2H_6$), among other possibilities. The phosphorus (P) containing compound may be diphosphorus pentoxide ($P_2O_5$), which may be formed by oxidation of phosphine ($PH_3$), among other possibilities.

A typical bi-layer BPSG includes a first BPSG layer stacked on a second BPSG layer, with both the first BPSG layer and the second BPSG layer have relatively equal thicknesses extending from top to a bottom of the layer. The first BPSG layer is formed having a single consistent concentration of boron and phosphorous compounds throughout the layer, and the second BPSG is formed having a single consistent concentration of boron and phosphorous compounds throughout the layer that differs from the first BPSG layer. Rather than having such a stacked bi-layer BPSG having two single concentrations of boron and phosphorous throughout each layer, the silicate material 203 according to the present disclosure may include a single gradient BPSG layer having a predetermined concentration depth of boron material and phosphorus material from a bottom portion 217 of the silicate material 203 to a top portion 215 of the silicate material 203 to form the silicate material 203 as a single gradient BSPG stack.

For example, in order to create the gradient BPSG stack to prevent tapering of the silicate material 230, the concentration of the boron and phosphorous may be controlled so as to gradually vary from a stronger dopant concentration at the bottom portion 217 of the silicate material 203 to a lesser dopant concentration at the top portion 215 of the silicate material 203. Such gradual variation in the concentration of boron and phosphorous from the bottom portion 217 of the silicate material 203 to the top portion 215 of the silicate material 203 gradually change between a range of 5.2 weight percentage (wt %) to a 1.0 wt % for the boron and a range of 6.2 wt % to a 3.5 wt % for the phosphorous, for example. In another example, the concentration of boron may vary from the bottom portion 217 of the silicate material 203 to the top portion 215 of the silicate material 203 while the concentration of phosphorous remains fixed. For example, the concentration of boron may gradually change between a range of 5.0 wt % and 1.0 wt % and the concentration of phosphorous may remain fixed at 5.2 wt % or 1.0 wt %.

In one example, the forming of the silicate material 203 to have the gradient BPSG stack may include varying a dopant concentration of boron in a linearly gradient manner from approximately 5.0 wt % at the bottom portion 217 of the silicate material to approximately 1.0 wt % at the top portion 215 of the silicate material 203, and varying a dopant concentration of phosphorous in a linearly gradient manner from approximately 5.2 wt % at the bottom portion 217 of the silicate material 203 to approximately 2.5 wt % at the top portion 215 of the silicate material 203.

In one example, the of etching of the silicate material to form the opening within the silicate material may be performed a vapor etch process, a wet etch process, and/or a dry etch process.

As a result, by controlling the concentration of the materials of the silicate material 203 to form a gradient BPSG stack, control of the etch rate may be increased. Such increased control of the etch rate may reduce tapering of the sidewall 220 of the silicate material 203 during etching that would otherwise occur as a result of the varying etch rates of the BPSG when formed merely as a bi-layer including two stacked BPSG layers, shown in FIG. 1. Such reduction in the occurrence of tapering of the sidewall 220 may enable the gradient BPSG of the present disclosure to increase the surface area of the capacitor, thereby increasing capacitance. In addition, such reduction in the occurrence of tapering of the sidewall 220 may also reduce the occurrence of necking or bending of the sidewall 220 during the etching process.

Figure 3:
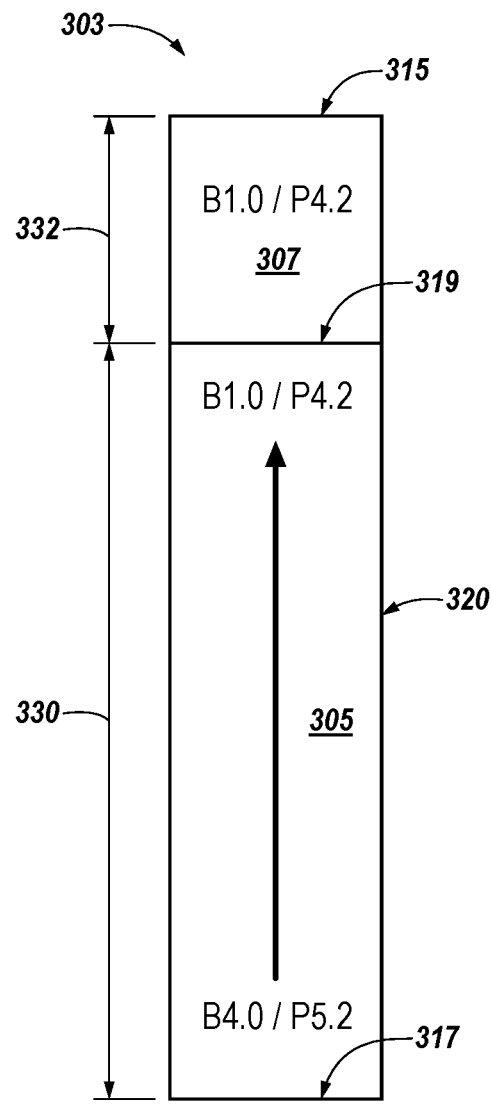

FIG. 3 is a schematic diagram of a silicate material layer formed during fabrication of a memory device in accordance with a number of embodiments of the present disclosure. In one example, in order to control the etch rate during etching a silicate material 303 may be formed as a gradient stack of BPSG having a first portion 305 and a second portion 307. The first portion 305 may extend from a transition point 319 within the silicate material 303 to a top portion 315 of the silicate material 303, and the second portion 307 may extend from a bottom portion 317 of the silicate material 303 to the transition point 319.

In order to further control the etch rate to reduce tapering of a sidewall 320 of the silicate material 303, described above, the transition point 317 may be positioned so that a distance 330 between the bottom portion 317 of the silicate material 303 and the transition point 317 of the silicate material 303 is greater than a distance 332 between the top portion 315 of the silicate material 303 and the transition point 319 of the silicate material 303. In addition, a gradually varying level of concentration of boron and phosphorous may extend within the first portion 305 of the gradient BPSG stack 303, and a relatively constant concentration of BPSG may extend within the second portion 307 of the gradient BPSG stack 303. For example, the silicate material 303 may include a predetermined concentration of boron and a predetermined concentration of phosphorous along the bottom portion 317 of the silicate material 303, and a predetermined concentration of boron and a predetermined concentration of phosphorous along the transition point 319 and within the second portion 307 of the silicate material 303.

For example, forming the silicate material 303 to have a gradient BPSG stack may include forming the silicate material 303 so that a level of a concentration of boron may be a 4.0 wt % along the bottom portion 317 of the silicate material 303 and a level of a concentration of phosphorous may be a 5.2 wt % along the bottom portion 317 of the silicate material 303. In addition, a level of concentration of boron may be a 1.0 wt % along both the transition point 319 and the top portion 315 of the silicate material 303 and a level of a concentration of phosphorous may be a 4.2 wt % along both the transition point 319 and the top portion 315 of the silicate material 303. In this way, the concentrations of boron and phosphorous along the bottom portion 317 gradually varies within the first portion 305 of the silicate material 303 to an adjusted concentration of boron and phosphorous located at the transition point 319, and remains constant or non-varying within the second portion 307 of the silicate material 303, i.e., between the transition point 319 and the top portion 315 of the silicate material 303 located positioned below the top portion 315 of the silicate material 303.

In one example, forming the silicate material 303 to have the BPSG stack may include a dopant concentration of boron formed to vary in a linearly gradient manner from approximately 4.0 wt % at the bottom portion 317 of the silicate material 303 and approximately 1.0 wt % at the transition point 319 of the silicate material 202. A dopant concentration of phosphorous may be formed so as to vary in a linearly gradient manner from approximately 5.2 wt % at the bottom portion 317 of the silicate material 303 and approximately 4.2 wt % at the transition point 319 of the silicate material 303. In addition, a dopant concentration of boron of approximately 1.0 wt % may be formed in a non-varying linear manner between the top portion 315 of the silicate material 303 and the transition point 319 of the silicate material 303, and a dopant concentration of phosphorous of approximately 5.2 wt % may be formed in a non-varying linear manner between the top portion 315 of the silicate material 303 and the transition point 119 of the silicate material 303.

In this way, in order to create the gradient BPSG stack in such a way as to prevent tapering of the silicate material 300, the concentration of the boron and phosphorous may be controlled so as to gradually vary from a bottom portion 317 of the silicate material 303 to the transition point 319, and remain constant between the transition point 319 and the top portion 315 of the silicate material 303. top portion 215 of the silicate material 203. As a result, by controlling the concentration of the materials of the silicate material 303 to form a gradient BPSG stack having the first portion 305 and the second portion 307 described above, control of the etch rate may be increased. Such increased control of the etch rate may reduce tapering of the sidewall 320 of the silicate material 303 during etching that would otherwise occur as a result of the varying etch rates of the BPSG when formed merely as a bi-layer including two stacked BPSG layers, shown in FIG. 1. Such reduction in the occurrence of tapering of the sidewall 320 may enable the gradient BPSG of the present disclosure to increase the surface area of the capacitor, thereby increasing capacitance. In addition, such reduction in the occurrence of tapering of the sidewall 320 may also reduce the occurrence of necking or bending of the sidewall 320 during the etching process.

Figure 4:
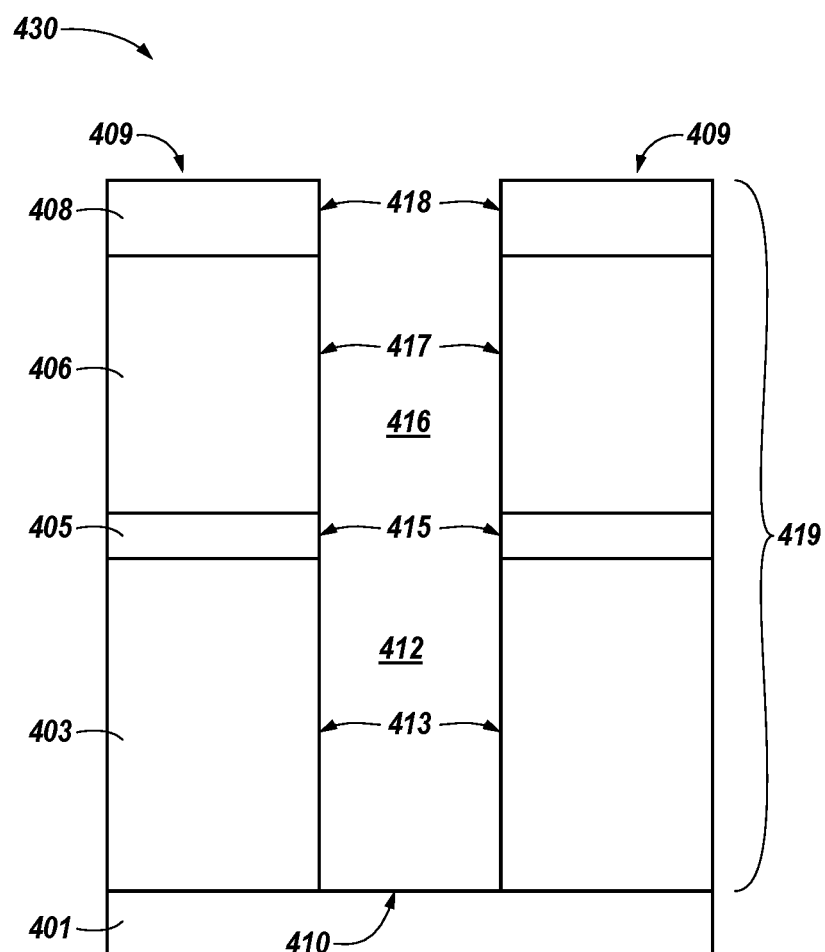

FIG. 4 illustrates a cross-sectional view of the portion of the example memory device at another point 430 in time in the example fabrication sequence described in connection with FIGS. 1-3 in accordance with a number of embodiments of the present disclosure. FIG. 4 illustrates a structure of the portion of the example memory device at a point 430 in time following of the etching process to form the second opening 116 of the silicate material 103 formed as described in FIGS. 2 and 3.

The first and second sidewalls 413, 420 of the first and the second portions 412, 416 thus may be substantially coplanar along the height of the opening 419 without tapering occurring along the sidewalls 413, 420.

Figure 5:
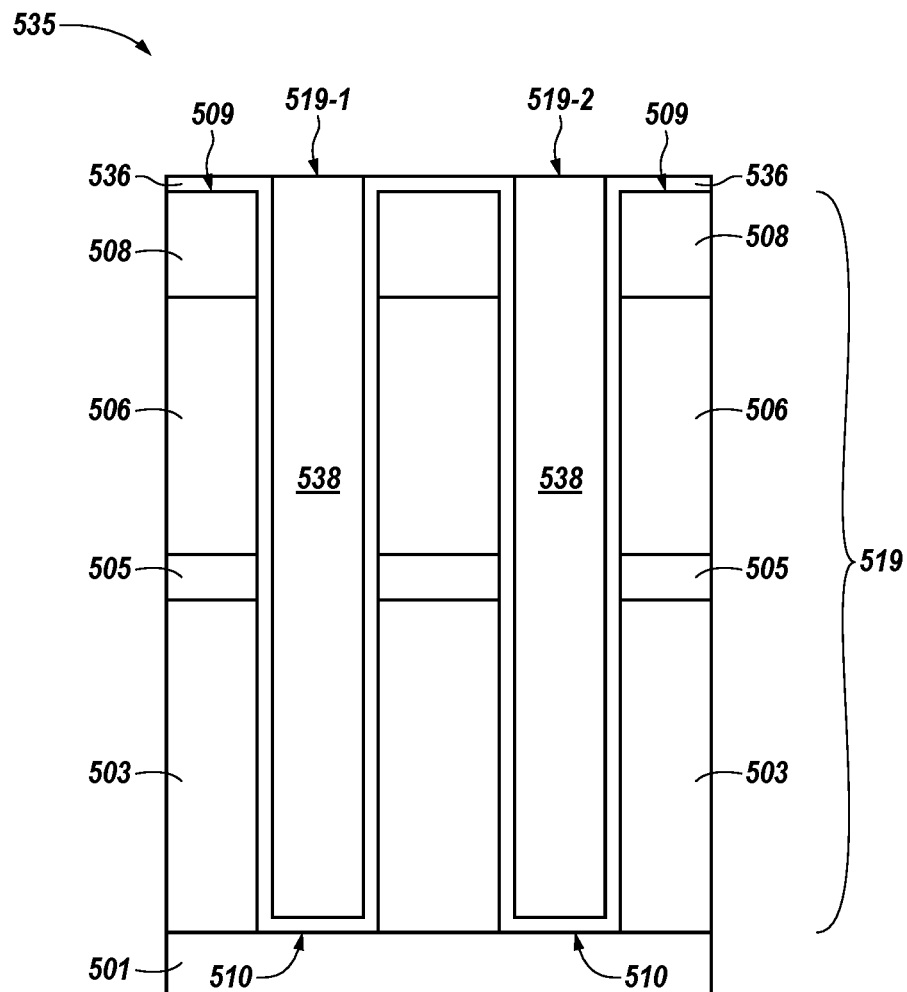
FIGS. 5-7 illustrate cross-sectional views of a portion of an example memory device at various points in time in an example fabrication sequence for formation of a capacitor in association with an opening in accordance with a number of embodiments of the present disclosure.

FIG. 5 illustrates a cross-sectional view of a portion of an example memory device at a point 535 in time in an example fabrication sequence for formation of a capacitor in association with an opening in accordance with a number of embodiments of the present disclosure. FIG. 5 illustrates a structure of the portion of the example memory device at a point 535 in time following completion of the fabrication sequence when the gradient BPSG described in conjunction with FIGS. 1-4 has been utilized.

As described in connection with FIG. 1-4, a first nitride material 505 may be formed (e.g., deposited) between a first silicate material 503 formed having a gradient BPSG stack, described above, and a second silicate material 506. A second nitride material 508 also may be formed (e.g., deposited) on a first surface of the second silicate material 506 opposite from a second surface on which the first nitride material 504 is formed. An opening 519 may extend from the substrate material 501 and may include a sidewall formed collectively from the sidewalls 420, 415, 413, and 418 of the respective first silicate material 403, the first nitride material 405, the second silicate material 406, and the second nitride material 408. For clarity in the example fabrication sequence, FIG. 5 shows a first opening 519-1 and a second opening 519-2 in the portion of the example memory device, although embodiments are not limited to two openings and may include any number of such openings.

As shown in FIG. 5 at point 535 in time, a first electrode material 536 has been formed (e.g., deposited) on the substrate material 510 and on the sidewalls of the openings 519-1, 519-2. In a number of embodiments, the first electrode material 536 also may have been formed on the upper surface 509 of the second nitride material 508. At point 535, a capacitor material 538 is shown as having been formed (e.g., deposited) to fill the openings 519-1, 519-2 from the substrate material 510 to a height of the opening 519 at the upper surface 509 of the second nitride material 508. In a number of embodiments, the capacitor material 538 may be deposited to fill the openings 519-1, 519-2 to an upper surface of the first electrode material 536. The first electrode material 536 and the capacitor material 538 may be formed from any conductive materials and to any width (e.g., thickness) usable in association with formation of an operable capacitor for a semiconductor device.

Figure 6:
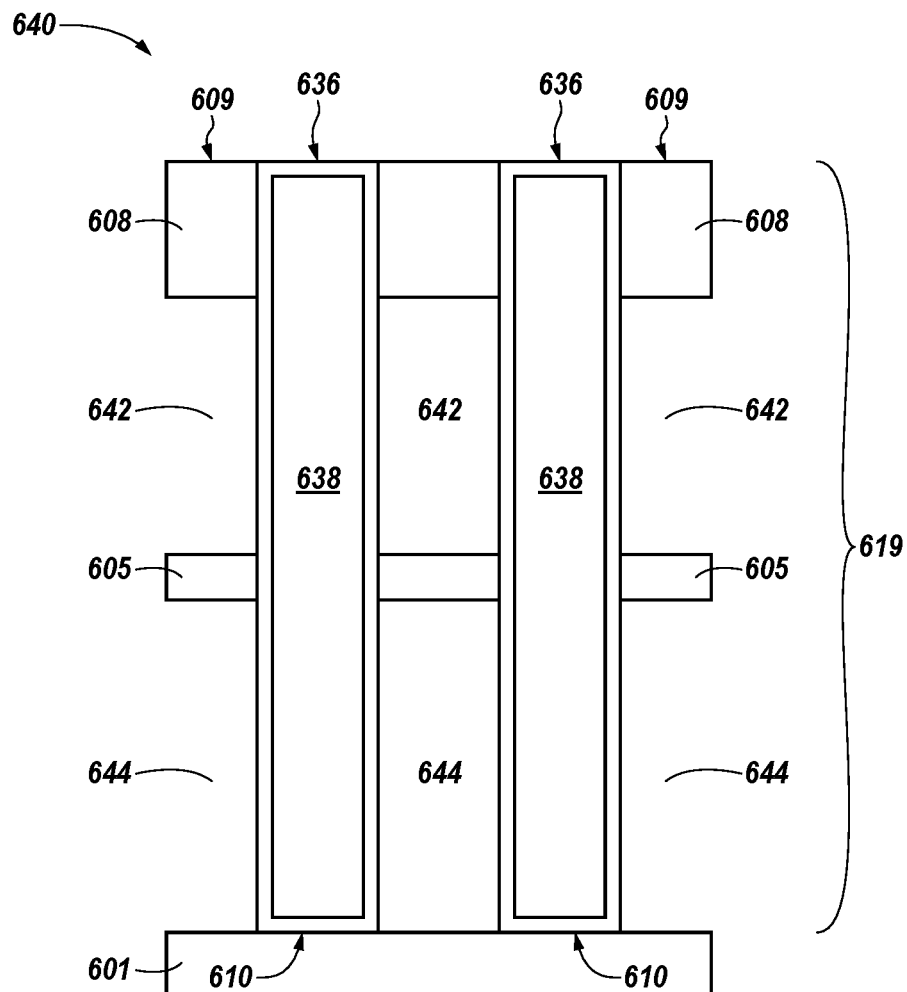

FIG. 6 illustrates a cross-sectional view of a portion of an example memory device at a point 640 in time in the example fabrication sequence for formation of a capacitor in accordance with a number of embodiments of the present disclosure. FIG. 6 illustrates a structure of the portion of the example memory device at a point 640 in time following completion of the example fabrication sequence described in connection with FIGS. 1-5.

As shown at point 640 in time, the first silicate material (e.g., gradient BPSG) shown at 503 in FIG. 5 and the second silicate material (e.g., TEOS) shown at 506 in FIG. 5 have been removed from the portion of the example memory device shown in FIG. 6. The first silicate material 503 and the second silicate material 506 may be removed with (via application of) a solvent that is selective for removing (e.g., dissolving) the first and second silicate materials from the memory device while not removing (e.g., leaving) other materials such that those materials remain in the memory device. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), and combinations thereof, among other possibilities. Removal of the first silicate material 503 and the second silicate material 506 may leave empty spaces (e.g., voids) 644 in the structure of the memory device.

In contrast, the application of the selective solvent may leave the capacitor material 638 having the first electrode material 636 formed on an outer surface thereof remaining in the structure of the memory device. In addition, the first nitride material 605 and the second nitride material 608 may be left remaining following the application of the selective solvent, among other possible components or structural features that may remain in the structure of the memory device. The remaining first nitride material 605 and the remaining second nitride material 608 may function as a capacitor support structure, as described further in connection with FIG. 7, to provide support in view of the voids 644 in the structure of the memory device.

At some time in association with the points 535 and 640, a portion of the capacitor material 638 in openings 519-1 and 519-2, along with the first electrode material 636 on an upper surface 609 of the second nitride material 608, may have been removed (e.g., etched). More of the first electrode material 636 may have been formed (e.g., deposited) on upper surfaces of remaining portions of the capacitor material 638 in the openings 519-1 and 519-2 such that the capacitor material 638 is covered on all surfaces with the first electrode material 636. An upper surface of the first electrode material 636 may, in a number of embodiments, be coplanar with the upper surface 609 of the second nitride material 608 such that a height of the capacitor material 638 covered by the first electrode material 636 may be the same as the height of the original opening 619.

Figure 7:
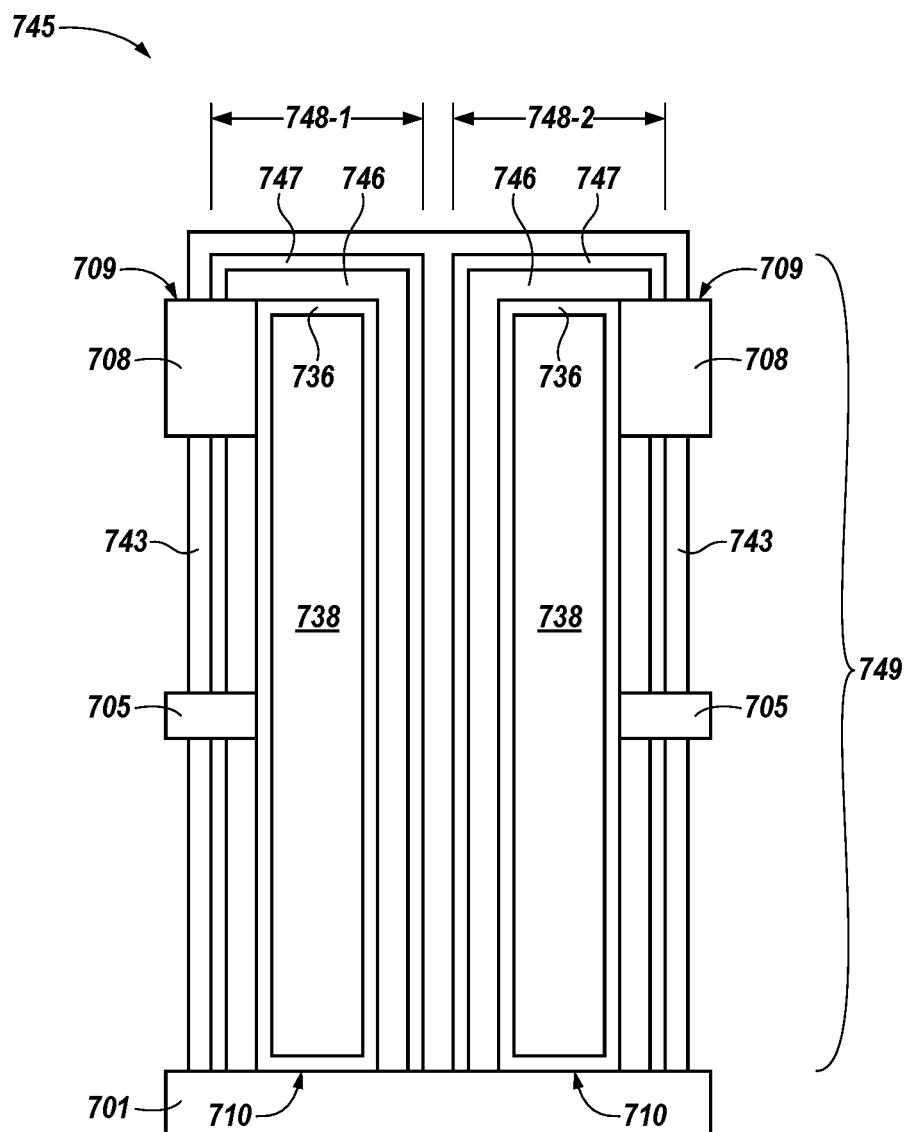

FIG. 7 illustrates a cross-sectional view of a portion of an example memory device at a point 745 in time in the example fabrication sequence for formation of a capacitor in accordance with a number of embodiments of the present disclosure. FIG. 7 illustrates a structure of the portion of the example memory device at a point 745 in time following completion of the example fabrication sequence described in connection with FIGS. 1-6.

As shown at point 745 in time, a dielectric material 746 has been formed (e.g., deposited) on an outer surface of the first electrode material 736. The dielectric material 746 may, in a number of embodiments, be formed from a surface 710 of the substrate material 701 to cover the outer surface, including an upper surface, of the first electrode material 736. A capacitor 748 may be subsequently formed, at least in part, by formation (e.g., deposition) of a second electrode material 747 on an outer surface of the dielectric material 746.

The portion of the example memory device illustrated in FIG. 7 shows a first capacitor 748-1 and a second capacitor 748-2 indicated as widths in the structure and formed as just described. A height 749 of the capacitors 748-1, 748-2 may be higher than the height of the original opening 619 due to the dielectric material 746 and second electrode material 747 being formed over the first electrode material 736. The example memory device illustrated in FIG. 7 shows a buffer material 743 that may be formed around and between the first and second capacitors 748-1, 748-2 as electrical insulation. The dielectric material 746, the second electrode material 747, and the buffer material 743 may be formed from any respective dielectric materials, conductive materials, and resistive materials and to any width (e.g., thickness) usable in association with formation of an operable capacitor for a semiconductor device.

The support structure is formed from the first nitride material 705 and the second nitride material 708, in addition to the underlying substrate material 701. The support structure may provide support to the first and second capacitors 748-1, 748-2 after the removal of the first and second silicate materials 503, 506 has left voids 644 in the structure of the memory device and even after such voids 644 may have been at least partially filled by the buffer material 743. The support structure formed from the first and second nitride materials 705, 708 is shown for simplicity to be attached only to the left side of the first electrode material 736 for capacitor 748-1 and the right side of the first electrode material 736 for capacitor 748-2. However, the support structure formed from the first and second nitride materials 705, 708 also may be on the opposite sides of (e.g., as shown in FIGS. 5-6), or may be attached at four position or even surround, the first and second capacitors 748-1, 748-2. In a number of embodiments, the dielectric material 746, the second electrode material 747, and/or the buffer material 743 may surround the first electrode material 736 of the capacitors 748-1, 748-2 except at defined positions where the first and second nitride materials 705, 708 of the support structure are attached to the first electrode material 736.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. The reduction in bending and/or twisting of the capacitors may reduce a possibility of unintended consequences, such as operational failure of the semiconductor device, need to replace parts, etc.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

Figure 8:
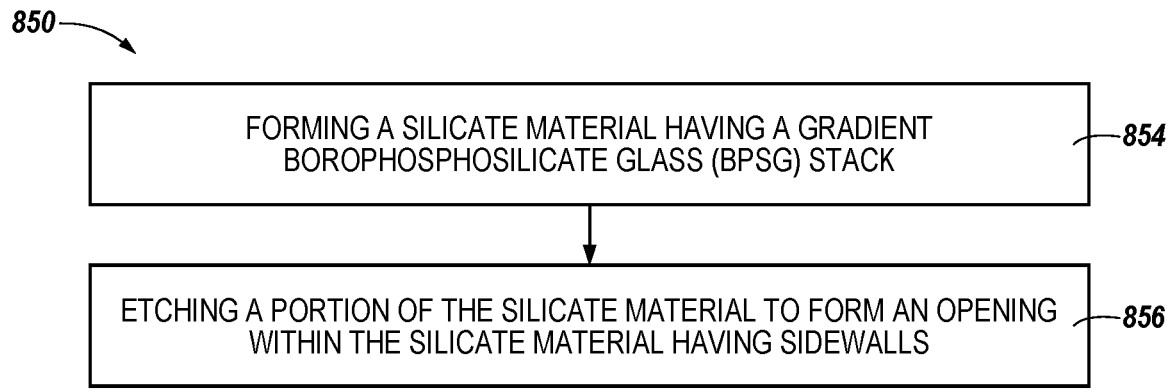
FIGS. 8-10 are flow diagrams of example methods for reduction of tapering on a sidewall of an opening in accordance with a number of embodiments of the present disclosure.

FIG. 8 is a flow diagram of an example method 850 for reduction of tapering of a sidewall during etching of an opening in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 852, the method 850 may include forming a silicate material having a gradient borophosphosilicate glass (BPSG) stack to reduce tapering. The silicate material may, in a number of embodiments, have been formed from a BPSG that may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material, as described herein.

In one example, the concentrations of boron and phosphorous gradually vary from a bottom portion of the silicate material to a top portion of the silicate material. The concentration of boron may vary between 5.2 and 1.0 and the concentration of phosphorous may vary between 6.2 and 3.5. In one example, the concentration of boron may be 4.0 along the bottom portion and 1.0 along the top portion. In addition, the concentration of phosphorous may be 5.2 along the bottom portion of the silicate material and 4.2 along the top portion of the silicate material.

At block 854, etching is performed along a portion of the silicate material to form an opening in the silicate material having side walls. As a result of the varying concentration of the boron and phosphorous within the gradient BPSG stack, tapering of the sidewalls may be reduced.

Figure 9:
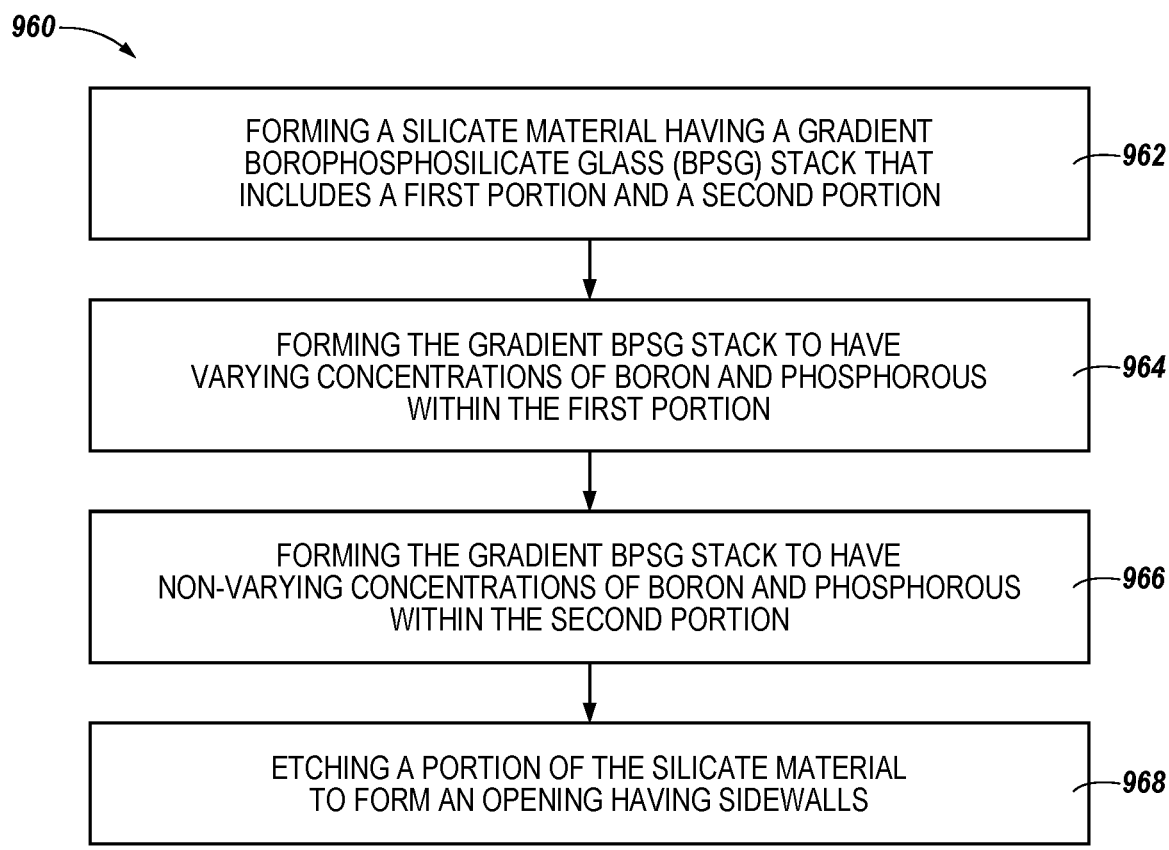

FIG. 9 is a flow diagram of another example method 960 for reduction of tapering of a sidewall during etching of an opening in accordance with a number of embodiments of the present disclosure. At block 962, the method 960 may include forming a silicate material having a gradient borophosphosilicate glass (BPSG) stack that includes a first portion and a second portion. The silicate material may, in a number of embodiments, have been formed from a BPSG that may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material, as described herein.

At block 964, the gradient BPSG stack is formed to have varying concentrations of boron and phosphorous within the first portion of the silicate material and at 966 the gradient BPSG stack is formed to have non-varying concentrations of boron and phosphorous within the second portion of the silicate material. In one example, the first portion may be greater than the second portion.

At block 966, etching is performed along a portion of the silicate material to form an opening in the silicate material having side walls. As a result of the varying concentration of the boron and phosphorous within the gradient BPSG stack, tapering of the sidewalls may be reduced during the etching of the silicate material.

In one example, the silicate material extends from a bottom portion to a top portion and the first portion extends a first distance between the bottom portion of the silicate material and a transition point positioned below the top portion of the silicate material. In addition, the second portion may extend a second distance between the top portion of the silicate material and the transition point.

In one example, the first distance may be 4800 angstroms and the second distance may be 1300 angstroms. The concentration of boron within the first portion may vary between 5.2 and 1.0 and the concentration of phosphorous within the first portion may vary between 6.2 and 3.5. In one example, the concentration of boron is 4.0 along the bottom portion and 1.0 along the transition point. The concentration of phosphorous may be 5.2 along the bottom portion and 4.2 along the transition point. In another example, the concentration of boron may be 1.0 and the concentration of phosphorous may be 5.2 between the top portion of the silicate material and the transition point.

Figure 10:
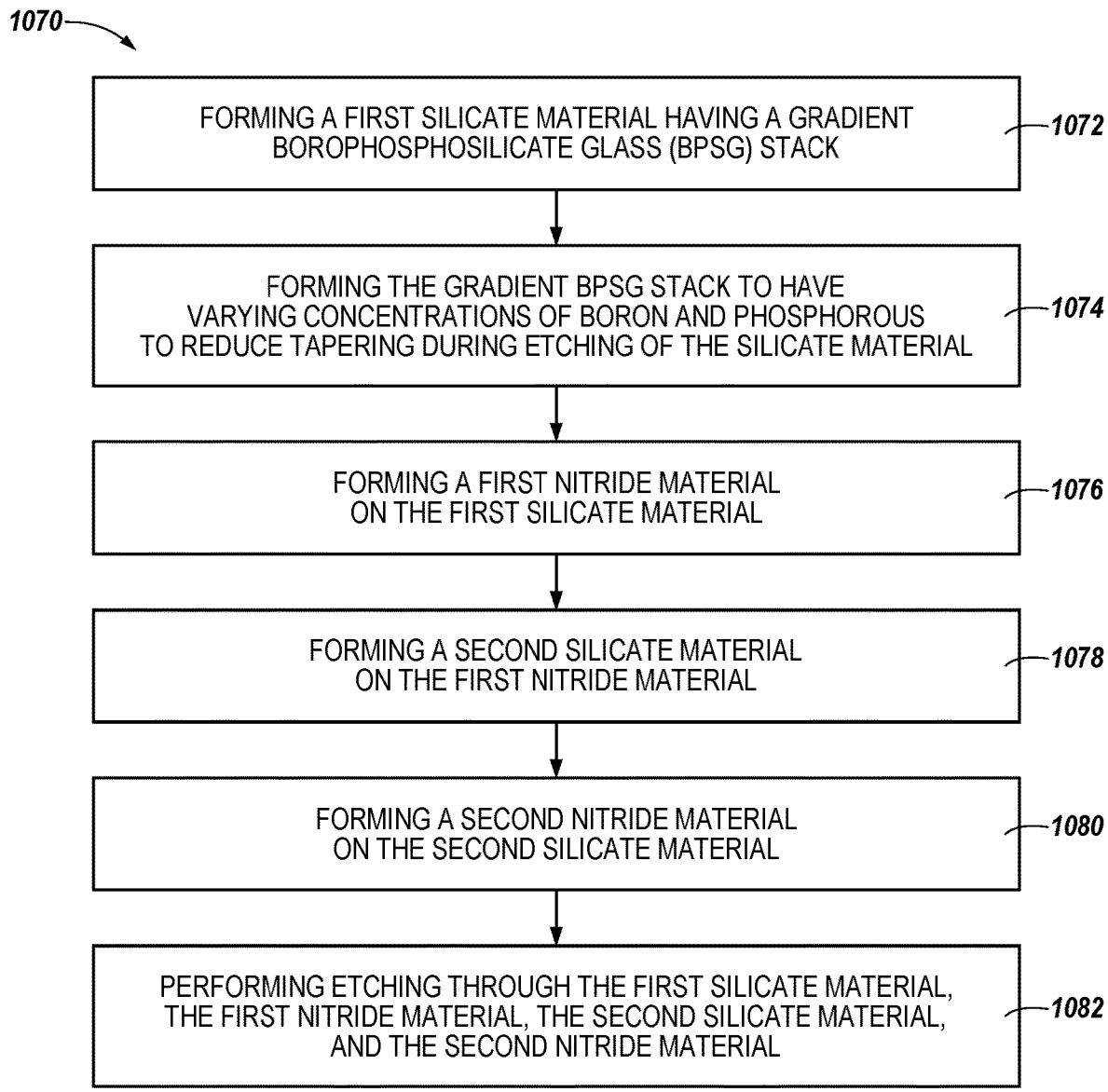

FIG. 10 is a flow diagram of another example method 1070 for reduction of tapering of a sidewall during etching of an opening in accordance with a number of embodiments of the present disclosure. At block 1072, the method 1070 may include forming a first silicate material having a gradient borophosphosilicate glass (BPSG) stack. The first silicate material may, in a number of embodiments, have been formed from a BPSG that may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material, as described herein.

At block 1074, the gradient BPSG stack is formed to have varying concentrations of boron and phosphorous to reduce tapering during etching of the silicate material. At block 1076, the method 1070 may include forming a first nitride material on the first silicate material. The first nitride material may be formed from a nitride material selected for dielectric or resistance properties. For example, one or more dielectric and/or resistor nitrides may be selected from boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material. The first nitride material may, in a number of embodiments, be deposited to a thickness in a range of from around 15 nm to around 30 nm above the surface of the first silicate material.

At block 1078, the method 1070 may include forming a second silicate material on the first nitride material. The second silicate material may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

At block 1080, the method 1070 may include forming a second nitride material on the second silicate material. Similar to the first nitride material, the second nitride material may be formed from a nitride material selected for dielectric or resistance properties. For example, one or more dielectric and/or resistor nitrides may be selected from BN, $SiN_X$, $Si_3N_4$, AlN, GN, TaN, $Ta_2N$, TiN, $Ti_2N$), and WN, $W_2N$, $WN_2$, among other possibilities, for formation of the second nitride material. In various embodiments, the first nitride material and the second nitride material may be formed from a same single nitride or a same mixture of nitrides or the first and second nitride materials each may be formed from a different single nitride or a different mixture of nitrides dependent upon, for example, various uses to which the nitrides may be applied. The second nitride material may, in a number of embodiments, be deposited to a thickness in a range of from around 80 nm to around 150 nm above the surface of the second silicate material.

At block 1082, etching is performed along a portion of the first silicate material, the first nitride material, the second silicate material, and the second nitride material to form an opening therein. As a result of the varying concentration of the boron and phosphorous within the gradient BPSG stack, tapering of the sidewalls may be reduced during the etching along the first silicate material.

In one example, the concentrations of boron and phosphorous may vary gradually from a bottom portion of the first silicate material to a top portion of the silicate material. In another example, forming the gradient BSPG stack to have varying concentrations of boron and phosphorous may include forming the gradient BSPG stack to have varying concentrations of boron and phosphorous within the first portion, and forming the gradient BSPG stack to have non-varying concentrations of boron and phosphorous within the second portion.

In another example, the first silicate material may include a first portion and a second portion, and the first silicate material may extend from a bottom portion to a top portion, the first portion extending a first distance between the bottom portion of the first silicate material and a transition point positioned below the top portion of the first silicate material, and the varying concentrations of boron and phosphorous are within the first portion. In another example, second portion may extend a second distance between the top portion of the silicate material and the transition point and the first distance may be greater than the second distance. In one example, the concentration of boron may be 4.0 and the concentration of phosphorous may be 5.2 along the bottom portion. In addition, the concentration of boron may be 1.0 along the transition point and the concentration of phosphorous may be 4.2 along the transition point and throughout the second portion of the silicate material.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to reduction of tapering on a sidewall of an opening, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to reduction of tapering on a sidewall of an opening than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    forming a silicate material to have a gradient borophosphosilicate glass (BPSG) stack on a semiconductor structure substrate, wherein forming the silicate material to have the gradient BPSG stack comprises:
        varying concentrations of boron and phosphorous gradually in a linearly gradient manner from a stronger dopant concentration at a bottom portion of the silicate material to a lesser dopant concentration at a top portion of the silicate material;
        forming a dopant concentration of boron of approximately 4.0 wt % at the bottom portion of the silicate material; and
        forming a dopant concentration of boron of approximately 1.0 wt % at the top portion of the silicate material; and
    etching a portion of the silicate material to form an opening within the silicate material having sidewalls, wherein the gradient BSPG stack comprises the varying concentrations of boron and phosphorous to reduce tapering of the sidewalls in response to the etching.

2. The method of claim 1, wherein forming the silicate material to have the gradient BPSG stack comprises:
    varying a dopant concentration of phosphorous in a linearly gradient manner from approximately 5.2 wt % at the bottom portion of the silicate material to approximately 4.2 wt % at the top portion of the silicate material.

3. A method, comprising:
    forming a silicate material to have a gradient borophosphosilicate glass (BPSG) stack, the BPSG stack having a first portion and a second portion, wherein forming the silicate material to have the BPSG stack comprises:
        forming the gradient BSPG stack to have varying concentrations of boron and phosphorous within the first portion, wherein a dopant concentration of boron is varied in a linearly gradient manner from approximately 4.0 wt % at a bottom portion of the silicate material and approximately 1.0 wt % at a transition point of the silicate material;
        forming the gradient BSPG stack to have non-varying concentrations of boron and phosphorous within the second portion; and
    etching a portion of the silicate material to form an opening within the silicate material having sidewalls, wherein the concentrations of boron and phosphorous within the first portion and the second portion reduce tapering of the sidewalls in response to the etching.

4. The method of claim 3, wherein the concentrations of boron and phosphorous in the first portion is greater than the concentrations of boron and phosphorous in the second portion.

5. The method of claim 3, wherein the silicate material extends from the bottom portion to a top portion and the first portion extends a first distance between the bottom portion of the silicate material and the transition point positioned below the top portion of the silicate material.

6. The method of claim 5, wherein the second portion extends a second distance between the top portion of the silicate material and the transition point of the silicate material.

7. The method of claim 6, wherein the first distance is approximately 4800 angstroms and the second distance is approximately 1300 angstroms.

8. The method of claim 3, wherein forming the silicate material to have the BPSG stack comprises varying a dopant concentration of phosphorous in a linearly gradient manner from approximately 5.2 wt % at the bottom portion of the silicate material and approximately 4.2 wt % at the transition point of the silicate material.

9. The method of claim 3, wherein forming the silicate material to have the gradient BPSG stack comprises:
    forming a dopant concentration of boron of approximately 1.0 wt % in a non-varying linear manner between the top portion of the silicate material and the transition point of the silicate material; and
    forming a dopant concentration of phosphorous of approximately 5.2 wt % in a non-varying linear manner between the top portion of the silicate material and the transition point of the silicate material.

10. The method of claim 3, wherein etching the portion of the silicate material to form the opening within the silicate material comprises utilizing one of a vapor etch process, a wet etch process, and a dry etch process.

11. A method, comprising:
forming a first silicate material having a gradient borophosphosilicate glass (BPSG) stack on a substrate;
forming the gradient BSPG stack to have varying concentrations of boron and phosphorous, wherein forming the gradient BSPG stack to have varying concentrations of boron and phosphorous comprises:
varying a dopant concentration of boron in a linearly gradient manner within a first portion from approximately 4.0 wt % at a bottom portion of the first silicate material to approximately 1.0 wt % at a transition point of the first silicate material; and
varying a dopant concentration of phosphorous in a linearly gradient manner within the first portion from approximately 5.2 wt % at the bottom portion of the silicate material to approximately 4.2 wt % at the transition point of the first silicate material;
forming a first nitride material on the first silicate material;
forming a second silicate material on the first nitride material;
forming a second nitride material on the second silicate material; and
performing etching through the first silicate material, the first nitride material, the second silicate material, and the second nitride material to form an opening having sidewalls, wherein the concentrations of boron and phosphorous reduce tapering of the sidewalls along the first silicate material in response to the etching.

12. The method of claim 11, wherein forming the gradient BSPG stack to have varying concentrations of boron and phosphorous comprises;
and
forming the gradient BSPG stack to have non-varying concentrations of boron and phosphorous within a second portion of the first silicate material.

13. The method of claim 11, wherein the first silicate material further comprises a second portion, and wherein the first silicate material extends from the bottom portion to a top portion, the first portion extends a first distance between the bottom portion of the first silicate material and the transition point positioned below the top portion of the first silicate material.

14. The method of claim 13, wherein the second portion extends a second distance between the top portion of the silicate material and the transition point.

15. The method of claim 13, wherein the first distance is greater than the second distance.

16. A method, comprising:
forming a silicate material to have a gradient borophosphosilicate glass (BPSG) stack on a semiconductor structure substrate, wherein forming the silicate material to have the gradient BPSG stack comprises:
varying concentrations of boron and phosphorous gradually from a stronger dopant concentration at a bottom portion of the silicate material to a lesser dopant concentration at a top portion of the silicate material;
forming a dopant concentration of phosphorous of approximately 5.2 wt % at the bottom portion of the silicate material; and
forming a dopant concentration of phosphorous of approximately 4.2 wt % at the top portion of the silicate material; and
etching a portion of the silicate material to form an opening within the silicate material having sidewalls, wherein the gradient BSPG stack comprises the varying concentrations of boron and phosphorous to reduce tapering of the sidewalls in response to the etching.

* * * * *